(12) United States Patent
Jung et al.

(10) Patent No.: US 10,101,378 B2
(45) Date of Patent: Oct. 16, 2018

(54) APPARATUS AND METHOD FOR DETECTING DIELECTRIC BREAKDOWN IN ECO-FRIENDLY VEHICLE

(71) Applicant: Hyundai Motor Company, Seoul (KR)

(72) Inventors: In Sung Jung, Seoul (KR); Hee Sung Moon, Seoul (KR)

(73) Assignee: Hyundai Motor Company, Seoul (KR)

( * ) Notice: Subject to any disclaimer, the term of this patent is extended or adjusted under 35 U.S.C. 154(b) by 56 days.

(21) Appl. No.: 15/217,534

(22) Filed: Jul. 22, 2016

(65) Prior Publication Data

US 2017/0160327 A1    Jun. 8, 2017

(30) Foreign Application Priority Data

Dec. 2, 2015   (KR) .................. 10-2015-0170941

(51) Int. Cl.
| | | |
|---|---|---|
| *G01R 31/06* | (2006.01) | |
| *G01R 31/00* | (2006.01) | |
| *G01R 31/36* | (2006.01) | |
| *G01R 31/12* | (2006.01) | |
| *B60L 3/00* | (2006.01) | |

(52) U.S. Cl.
CPC ........... *G01R 31/006* (2013.01); *G01R 31/12* (2013.01); *G01R 31/3644* (2013.01); *B60L 3/0069* (2013.01)

(58) Field of Classification Search
CPC .. G01R 31/007; G01R 31/026; G01R 31/006; G01R 31/025; G01R 31/3278; G01R 31/327; G01R 31/06; G01R 31/3277; B60L 3/0069

USPC .......................................................... 324/503
See application file for complete search history.

(56) References Cited

U.S. PATENT DOCUMENTS

| | | | | |
|---|---|---|---|---|
| 4,721,916 A | * | 1/1988 | Hanasawa | .......... G01R 31/1272 324/520 |
| 5,198,773 A | * | 3/1993 | Latta | ....................... G01M 3/40 324/464 |
| 6,977,518 B2 | * | 12/2005 | Higashihama | ....... G01R 31/025 324/500 |
| 7,773,353 B2 | * | 8/2010 | Uchida | ..................... B60L 3/00 324/503 |

(Continued)

FOREIGN PATENT DOCUMENTS

| | | |
|---|---|---|
| JP | 09138206 A * | 5/1997 |
| JP | 2005-304138 A | 10/2005 |

(Continued)

OTHER PUBLICATIONS

Cameron, A. W. W. "Diagnoses of ac generator insulation condition by nondestructive tests." Transactions of the American Institute of Electrical Engineers. Part III: Power Apparatus and Systems 71.1 (1952): 263-274.*

*Primary Examiner* — Christopher McAndrew
(74) *Attorney, Agent, or Firm* — Mintz Levin Cohn Ferris Glovsky and Popeo, P.C.; Peter F. Corless (57) ABSTRACT

An apparatus and a method for detecting a dielectric breakdown in an eco-friendly vehicle are provided. The apparatus includes a measurer that is configured to measure resistance values of insulation resistors disposed across a high voltage battery and a controller that is configured to measure a voltage applied to the insulation resistor using the measurer and analyze a pattern of the measured voltage to detect a dielectric breakdown portion.

13 Claims, 5 Drawing Sheets

(56) References Cited

U.S. PATENT DOCUMENTS

| | | | | |
|---|---|---|---|---|
| 9,312,797 | B2* | 4/2016 | Hayashi | H02P 27/06 |
| 2004/0227521 | A1* | 11/2004 | Higashihama | G01R 31/025 |
| | | | | 324/522 |
| 2005/0242820 | A1* | 11/2005 | Kume | H01M 10/4285 |
| | | | | 324/426 |
| 2006/0145645 | A1* | 7/2006 | Kim | H02H 5/083 |
| | | | | 318/483 |
| 2009/0102321 | A1* | 4/2009 | Ohnishi | G01N 29/022 |
| | | | | 310/336 |
| 2009/0121200 | A1* | 5/2009 | Bates | C08G 65/34 |
| | | | | 252/579 |
| 2010/0308283 | A1* | 12/2010 | Bates | C08G 65/34 |
| | | | | 252/579 |
| 2012/0120530 | A1* | 5/2012 | Yoon | B60L 3/0069 |
| | | | | 361/42 |
| 2012/0223734 | A1* | 9/2012 | Takada | H02S 50/10 |
| | | | | 324/761.01 |
| 2012/0302396 | A1* | 11/2012 | Park | B60K 6/442 |
| | | | | 477/5 |
| 2015/0084551 | A1* | 3/2015 | Hayashi | H02P 27/06 |
| | | | | 318/8 |

FOREIGN PATENT DOCUMENTS

| | | |
|---|---|---|
| JP | 2008-029165 A | 2/2008 |
| KR | 1999-0025011 U | 7/1999 |
| KR | 2012-0030198 A | 3/2012 |
| KR | 10-1388466 B1 | 4/2014 |

* cited by examiner

APPARATUS AND METHOD FOR DETECTING DIELECTRIC BREAKDOWN IN ECO-FRIENDLY VEHICLE

CROSS-REFERENCE TO RELATED APPLICATION

This application is based on and claims the benefit of priority to Korean Patent Application No. 10-2015-0170941, filed on Dec. 2, 2015 in the Korean Intellectual Property Office, the disclosure of which is incorporated herein in its entirety by reference.

BACKGROUND (a) Field of the Invention

The present disclosure relates to an apparatus and a method for detecting a dielectric breakdown, and more particularly, to detecting a dielectric breakdown portion based on a waveform analysis of an insulation resistance voltage.

(b) Description of the Related Art

Generally, eco-friendly vehicles such as hybrid vehicles and electric vehicles include an insulation resistance measurer configured to detect whether dielectric breakdown occurs to prevent damage due to electric leakage. The existing insulation resistance measurer uses an insulation resistance instantaneous value under the alternating current (AC) dielectric breakdown environment (e.g., the environment typically includes a variable frequency component), and therefore has a measurement value adjusted based on a size of a variable frequency. Accordingly, the measurement accuracy is reduced when an average value of a pack voltage is used over the entire measurement section. Further, the existing insulation resistance measurer may not differentiate a portion where the dielectric breakdown occurs.

The above information disclosed in this section is merely for enhancement of understanding of the background of the invention and therefore it may contain information that does not form the prior art that is already known in this country to a person of ordinary skill in the art.

SUMMARY

The present disclosure provides an apparatus and a method for detecting a dielectric breakdown in an eco-friendly vehicle capable of detecting a dielectric breakdown portion based on a waveform analysis of an insulation resistance voltage. According to an exemplary embodiment of the present disclosure, an apparatus for detecting a dielectric breakdown in an eco-friendly vehicle may include a measurer configured to measure resistance values of insulation resistors positioned across a high voltage battery and a controller configured to measure a voltage applied to the insulation resistor using the measurer and analyze a pattern of the measured voltage to detect a dielectric breakdown portion.

The measurer may include a first resistor and a second resistor configured to be coupled to each of the insulation resistors disposed across the high voltage battery in series, a first switch and a second switch configured to be coupled to the first resistor and the second resistor in series and alternately switched, a third resistor configured to be coupled to a contact disposed between the first switch and the second switch and a comparator configured to measure a voltage across the third resistor.

The controller may be configured to calculate the resistance values of the insulation resistors depending on a voltage divider rule based on the voltage across the third resistor. The controller may be configured to select any one of the first switch and the second switch upon an entry into a dielectric breakdown detection mode to switch the selected switch to a closed state. The controller may further be configured to measure the voltage applied to the insulation resistor by the measurer when the selected switch is switched to the closed state. The controller may be configured to determine that the dielectric breakdown is a direct current (DC) dielectric breakdown when a slope of the insulation resistance voltage converges to a specific value. The controller may be configured to determine that the dielectric breakdown is an AC dielectric breakdown when the slope of the insulation resistance voltage adjusts to a negative value and a positive value.

According to another exemplary embodiment of the present disclosure, a method for detecting a dielectric breakdown in an eco-friendly vehicle may include measuring a voltage applied to insulation resistors positioned across a high voltage battery and determining a dielectric breakdown portion based on a waveform of the insulation resistance voltage. The measuring of the insulation resistance voltage may include selecting any one of a first switch and a second switch upon an entry into a dielectric breakdown detection mode and switching the selected switch to a closed state and measuring the insulation resistance voltage when the selected switch is in the closed state. The determining of the dielectric breakdown portion may include confirming an adjustment in a slope of the insulation resistance voltage; and determining a dielectric breakdown portion based on the adjustment in the slope of the insulation resistance voltage. When the change in the slope is confirmed, the insulation resistance voltage may be confirmed under a previous insulation resistance voltage.

In response to determine that the insulation resistance voltage is less than the previous insulation resistance voltage, a voltage average of a battery pack over the entire measurement section and an instantaneous value of the insulation resistance voltage measured when a measurement period ends may be calculated. The dielectric breakdown may be determined to be a DC dielectric breakdown based on the calculated result. Additionally, in response to determining that the insulation resistance voltage exceeds the previous insulation resistance voltage, the voltage average of the battery pack within the same measurement period and an average of the insulation resistance voltage measured may be calculated. The dielectric breakdown may be determined to be an AC dielectric breakdown based on the calculated result.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Hereinafter, exemplary embodiments of the present disclosure will be described with reference to the accompanying drawings. It is to be noted that in giving reference numerals to components of each of the accompanying drawings, the same components will be denoted by the same reference numerals even though they are shown in different drawings. Further, in describing exemplary embodiments of the present disclosure, well-known constructions or functions will not be described in detail in the case in which they may unnecessarily obscure the understanding of the exemplary embodiments of the present disclosure.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, in order to make the description of the present invention clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

Figure 1:
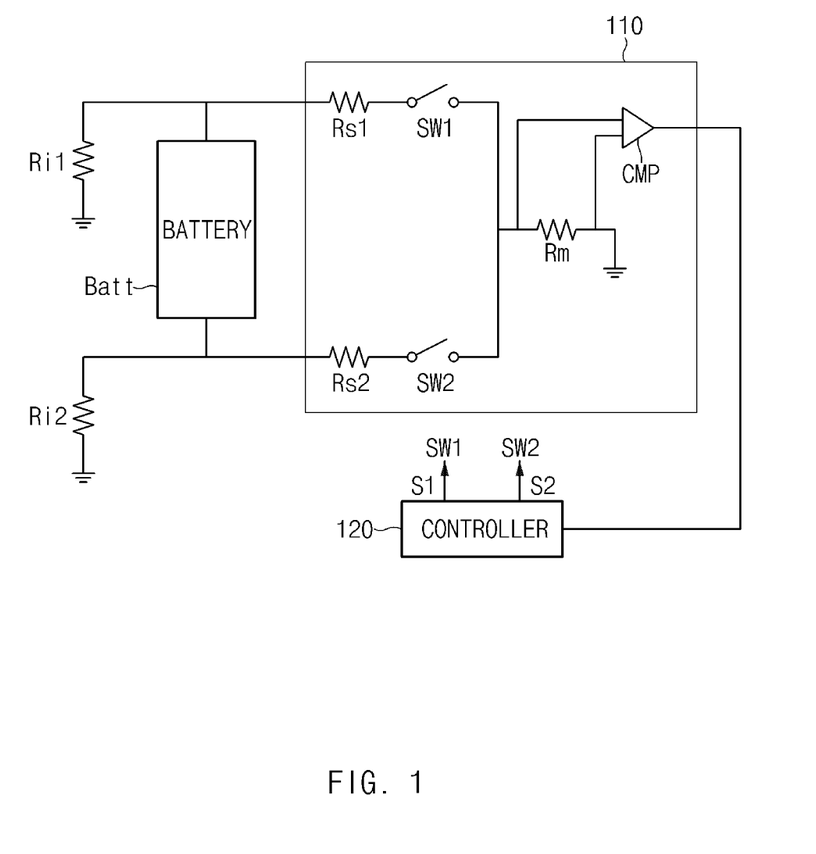
FIG. 1 is an exemplary block configuration diagram illustrating an apparatus for detecting a dielectric breakdown in an eco-friendly vehicle according to an exemplary embodiment of the present disclosure.
Figure 2:
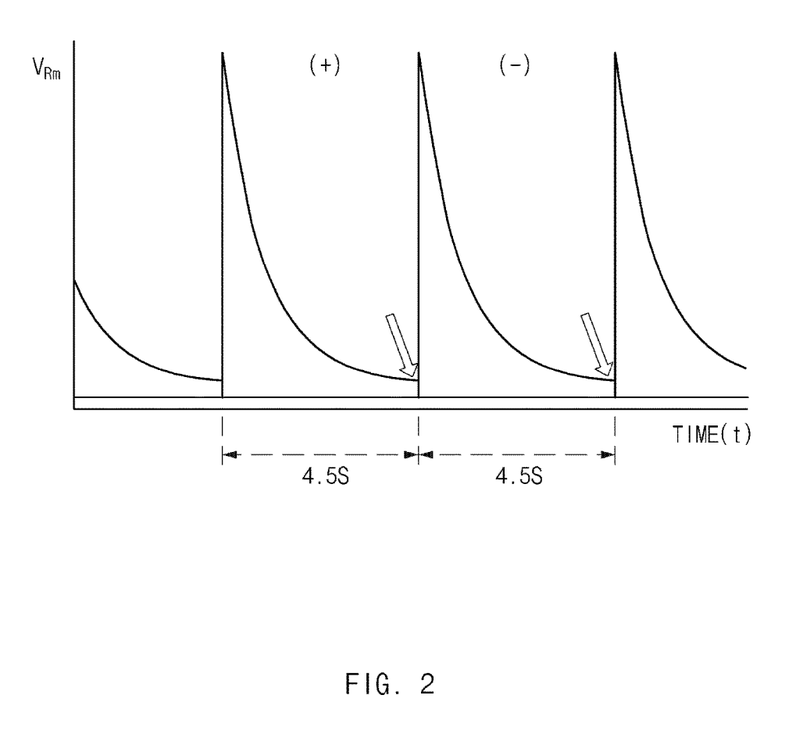
FIG. 2 is an exemplary graph of an insulation resistance voltage measured in an insulation state associated with an exemplary embodiment of the present disclosure.
Figure 3A:
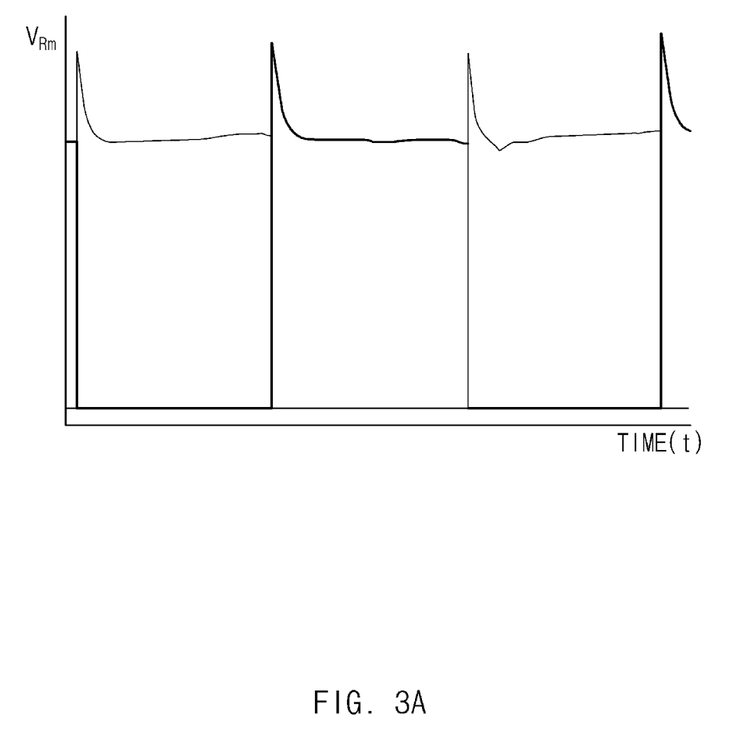
FIGS. 3A and 3B are exemplary graphs of an insulation resistance voltage measured in the dielectric breakdown state associated with an exemplary embodiment of the present disclosure.
Figure 3B:
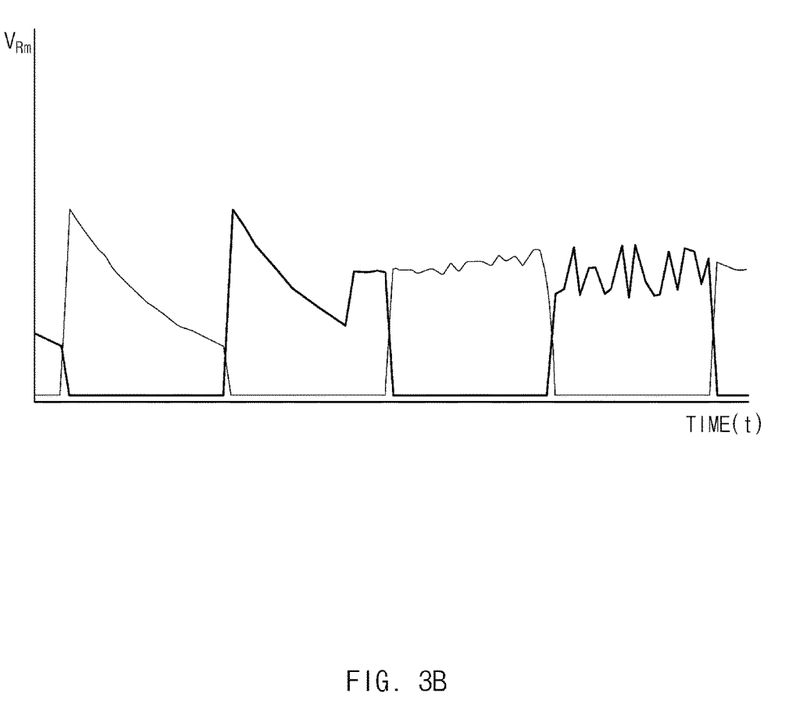

FIG. 1 is an exemplary block configuration diagram illustrating an apparatus that detects a dielectric breakdown in an eco-friendly vehicle according to an exemplary embodiment of the present disclosure. FIG. 2 is an exemplary graph of an insulation resistance voltage measured in an insulation state associated with the present disclosure. FIGS. 3A and 3B are exemplary graphs of an insulation resistance voltage measured in the dielectric breakdown state associated with the present disclosure.

As illustrated in FIG. 1, the apparatus that detects a dielectric breakdown in an eco-friendly vehicle may include a measurer 110 and a controller 120. The apparatus may be installed within a battery management system (BMS). Particularly, the measurer 110 may be configured to measure a resistance value of a first insulation resistor Ri1 or a second insulation resistor Ri2 disposed between a high voltage battery Batt installed within a vehicle and their own grounds. The first insulation resistor Ri1 and the second insulation resistor Ri2 may be disposed at first and second terminals of the high voltage battery Batt. The measurer 110 may include a first resistor Rs1, a second resistor Rs2, a third resistor Rm, a first switch SW1, a second SW2, and a comparator CMP.

A first terminal of the first resistor Rs1 may be coupled in series to the first insulation resistor Ri1 and a second terminal of the first resistor Rs1 may be coupled in series to a first terminal of the first switch SW1. A first terminal of the second resistor Rs2 may be coupled in series to the second insulation resistor Ri2 and a second terminal of the second insulation resistor Ri2 may be coupled in series to a first terminal of the second switch SW2. The second resistor Rs2 and the first resistor Rs1 may be connected in parallel. The first switch SW1 and the second switch SW2 may be alternately closed. When the first switch SW1 is switched to a closed state, the second switch SW2 may be switched to an opened state. For example, when the first switch SW1 is switched to an opened state, the second switch SW2 may be switched to a closed state.

The measurer 110 may be configured to measure the resistance value of the insulation resistor Ri1 connected to a positive (+) terminal of the battery Batt when the first switch SW1 is in a closed state and may be configured to measure the resistance value of the insulation resistor Ri2 coupled to a negative (−) terminal of the battery Batt when the second switch SW2 is in a closed state. The third resistor Rm may be disposed between a contact between the first switch SW1 and the second switch SW2 and their own grounds. The third resistor Rm may be coupled to the first resistor Rs1 or the second resistor Rs2 in series based on an operation of the first switch SW1 and the second switch SW2.

The comparator CMP may be configured to sense a voltage VRm across the third resistor Rm and transmit the sensed voltage VRm to the controller 120. The comparator CMP may also be configured to measure the voltage VRm across the third resistor Rm based on the insulation resistance. The comparator CMP may be configured to measure a voltage applied to the third resistor Rm based on a control of the controller 120 when the voltage is stabilized. For example, as illustrated in FIG. 2, the voltage applied to the third resistor Rm may be measured when the voltage is stabilized (arrow). The controller 120 may be configured to operate the measurer 110 to periodically measure the resistance value (e.g., insulation resistance value) of the insulation resistor (Ri1 or Ri2). In particular, the controller 120 may be configured to utilize the voltage measured by the measurer 110 to calculate the insulation resistance value based on a voltage divider rule.

The controller 120 may be configured to transmit a switching command to the first switch SW1 and the second switch SW2 when the controller enters a dielectric breakdown detection mode to switch the first switch SW1 or the second switch SW2 to the closed state. The closed state of the switches SW1 and SW2 may be maintained for ½ of one period T and the voltage (e.g., insulation resistance voltage) applied to the insulation resistor for the period may be measured. The controller 120 may be configured to separately detect when the dielectric breakdown is a dielectric breakdown at an AC terminal or a dielectric breakdown at a DC terminal based on a waveform analysis of an insulation resistance voltage Viso(t) measured. The controller 120 may be configured to determine that the dielectric breakdown is the DC dielectric breakdown when a slope of the insulation resistance voltage measured is continuously converged to a specific value (e.g., 0 or negative value) for the measurement period. As illustrated in FIG. 3A, the controller 120 may be configured to determine that the dielectric breakdown is the DC dielectric breakdown when the slope of the insulation resistance voltage is converged to the specific value and thus the insulation resistance voltage may be stabilized.

Further, the controller 120 may be configured to determine that the dielectric breakdown is the AC dielectric breakdown when the slope of the insulation resistance voltage measured is continuously adjusted to a negative value and a positive value. As illustrated in FIG. 3B, when the slope of the insulation resistance voltage is continuously adjusted to a negative value and a positive value due to a 3 phase control, the controller 120 may be configured to determine that the dielectric breakdown is the AC dielectric breakdown. For example, the controller 120 may be configured to measure the current insulation resistance voltage Viso(t) using the measurer 110. Further, the controller 120 may be configured to confirm when the measured current insulation resistance voltage Viso(t) is less than the insulation resistance voltage (e.g., previous insulation resistance voltage) Viso(t−1) previously measured. In other words, the controller 120 may be configured to confirm when a reversal of the slope of the insulation resistance voltage Viso(t) occurs.

The controller 120 may be configured to confirm that the measurement period (measurement section) ends when the insulation resistance voltage Viso(t) measured is less than the voltage Viso(t−1) previously measured. For example, the controller 120 may be configured to confirm that the measurement period reaches T/2. The controller 120 may be configured to calculate a voltage average of a battery pack over the entirety of the measurement section and an instantaneous value of the insulation resistance voltage measured when the measurement period ends. The controller 120 may be further configured to determine that the dielectric breakdown is the DC dielectric breakdown when the calculated values are less than a preset threshold value. In particular, the threshold value may be a value previously acquired by an experiment Moreover, the controller 120 may be configured to calculate the voltage average of the battery pack within the same measurement period and the average of the insulation resistance voltage measured when the insulation resistance voltage Viso(t) measured exceeds the previous measurement voltage Viso(t−1). The controller 120 may be configured to determine that the dielectric breakdown is the AC dielectric breakdown when the calculated average values are less than the preset threshold value. For example, the threshold value may be a value previously acquired by an experiment. Here, the threshold value is depended on an insulated circuit configuration.

Figure 4:
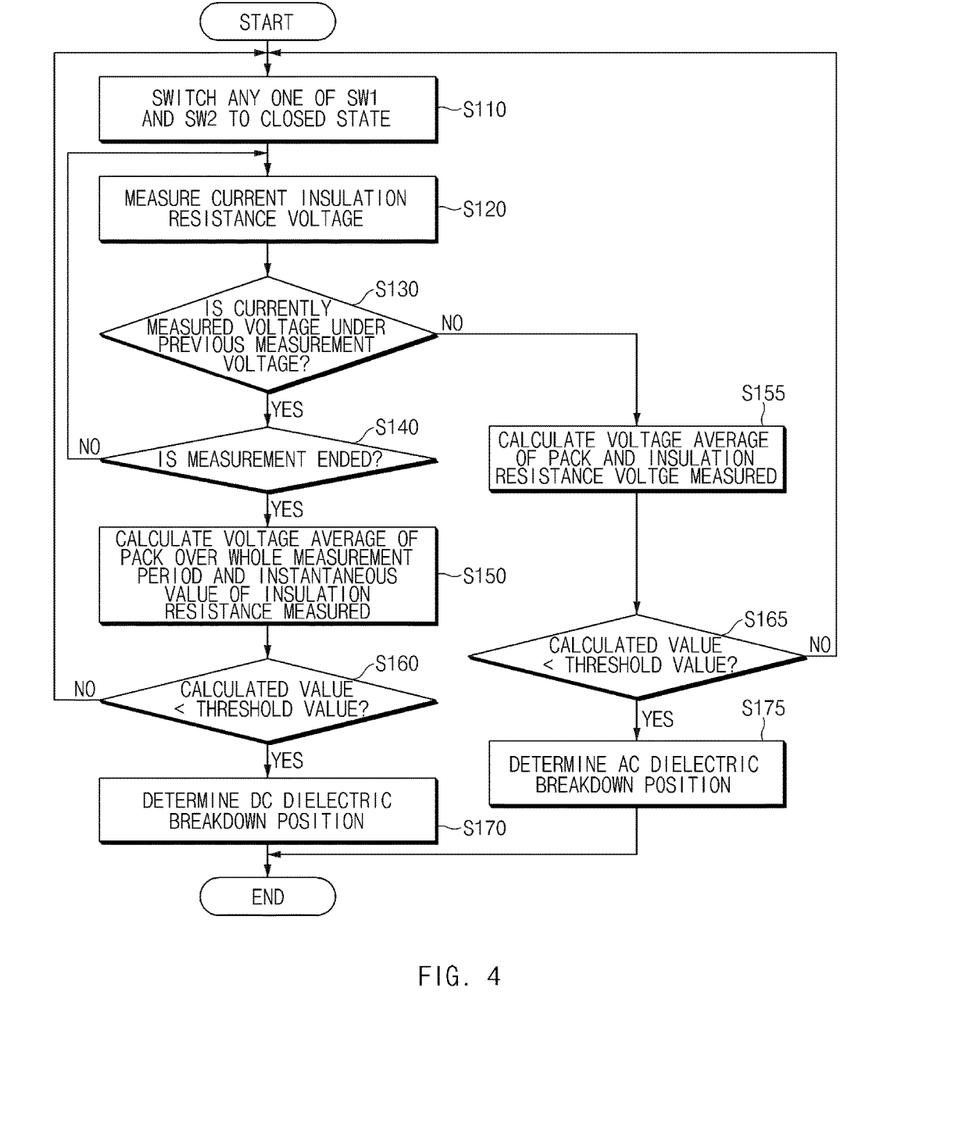
FIG. 4 is an exemplary flow chart illustrating a method for detecting a dielectric breakdown in an eco-friendly vehicle according to an exemplary embodiment of the present disclosure.

FIG. 4 is an exemplary flow chart illustrating a method for detecting a dielectric breakdown in an eco-friendly vehicle according to an exemplary embodiment of the present disclosure. The method for detecting a dielectric breakdown according to an exemplary embodiment of the present disclosure may measure the voltage applied to the insulation resistors positioned at both terminals of the high voltage battery and analyze the waveform of the measured voltage to determine whether the dielectric breakdown is the AC terminal dielectric breakdown or the DC terminal dielectric breakdown. Hereinafter, the method for detecting a dielectric breakdown will be described in more detail.

The controller 120 may be configured to select any one of the first switch SW1 and the second switch SW2 of the measurer 110 upon the entry into the dielectric breakdown detection mode and switches the selected switch to the closed state (S110). The controller 120 may be configured to measure the current voltage applied to the insulation resistor using the measurer 110 when the selected switch SW1 or SW2 is switched to the closed state (S120). The controller 120 may be configured to compare the insulation resistance voltage currently measured with the insulation resistance voltage (e.g., previous insulation resistance voltage) previously measured (S130). In other words, the controller 120 may be configured to confirm the slope of the insulation resistance voltage measured to confirm whether the slope has been reversed. The controller 120 may be configured to confirm whether the measurement period (e.g., section) ends when the current insulation resistance voltage is less than the previous insulation resistance voltage (S140). The controller 120 may be configured to calculate the voltage average of the battery pack over the entirety of the measurement section and the instantaneous value of the insulation resistance voltage measured when the measurement period ends (S150). The controller 120 may be configured to determine that the dielectric breakdown is the DC dielectric breakdown when the calculated values are less than the preset threshold value (S160 and S170).

When the current insulation resistance voltage is equal to or greater than the previous insulation resistance voltage S130, the controller 120 may be configured to calculate the voltage averages of the battery pack within the same measurement period and the average of the insulation resistance voltage measured (S155). The controller 120 may be configured to confirm whether the calculated average values are less than the preset threshold value (S165). The controller 120 may be further configured to determine that the dielectric breakdown is the AC dielectric breakdown when the calculated voltage average of the pack and the average of the insulation resistance voltage measured are less than the preset threshold value (S175).

As described above, according to the exemplary embodiments of the present disclosure, the dielectric breakdown portion (position) may be detected by measuring the voltage applied to the insulation resistor and analyzing the measured voltage waveform. In other words, the present disclosure may differentiate the dielectric breakdown at the AC terminal or the dielectric breakdown at the DC terminal. Further, the present disclosure may minimize the effect of the high frequency component introduced into the insulation resistance measurer of the battery management system by the high voltage system circuit.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. An apparatus for detecting a dielectric breakdown in an eco-friendly vehicle, comprising:
   a measurer configured to measure resistance values of a first insulation resistor and a second insulation resistor disposed at a first and second terminals of a high voltage battery; and
   a controller configured to measure a voltage applied to the insulation resistor using the measurer and analyze a pattern of the measured voltage to detect a dielectric breakdown portion,
   wherein the first insulation resistor is coupled in series to a first resistor and the second insulation resistor is coupled in series to a second resistor, and the first resistor and the second resistor is connected in parallel.

2. The apparatus according to claim 1, wherein the measurer includes:
   a first resistor and a second resistor connected in series to each of the insulation resistors disposed across the high voltage battery;
   a first switch and a second switch connected in series to the first resistor and the second resistor and alternately switched;
   a third resistor connected to a contact disposed between the first switch and the second switch; and
   a comparator configured to measure a voltage across the third resistor.

3. The apparatus according to claim 2, wherein the controller is configured to calculate the resistance values of the insulation resistors depending on a voltage divider rule based on the voltage across the third resistor.

4. The apparatus according to claim 2, wherein the controller is configured to select any one of the first switch and the second switch upon an entry into a dielectric breakdown detection mode to switch the selected switch to a closed state.

5. The apparatus according to claim 4, wherein the controller is configured to measure the voltage applied to the insulation resistor by the measurer when the selected switch is switched to the closed state.

6. The apparatus according to claim 5, wherein the controller is configured to determine that the dielectric breakdown is a direct current (DC) dielectric breakdown based on a slope of the insulation resistance voltage convergence to a specific value.

7. The apparatus according to claim 5, wherein the controller is configured to determine that the dielectric breakdown is an alternating current (AC) dielectric breakdown when a slope of the insulation resistance voltage is adjusted to a negative value and a positive value.

8. A method for detecting a dielectric breakdown in an eco-friendly vehicle, comprising:
   measuring, by a controller a voltage applied to a first insulation resistor and a second insulation resistor disposed at a first and second terminal of a high voltage battery; and
   determining, by a controller a dielectric breakdown portion based on a waveform of the insulation resistance voltage,
   wherein the first insulation resistor is coupled in series to a first resistor and the second insulation resistor is coupled in series to a second resistor, and the first resistor and the second resistor is connected in parallel.

9. The method according to claim 8, wherein the measuring of the insulation resistance voltage includes:
   selecting, by a controller any one of a first switch or a second switch upon an entry into a dielectric breakdown detection mode and switching the selected switch to a closed state; and
   measuring, by a controller the insulation resistance voltage when the selected switch is disposed in the closed state.

10. The method according to claim 8, wherein the determining of the dielectric breakdown portion includes:
    confirming, by a controller a change in a slope of the insulation resistance voltage; and
    determining, by a controller the dielectric breakdown portion based on the change in the slope of the insulation resistance voltage.

11. The method according to claim 10, wherein whether the insulation resistance voltage is less than a previous insulation resistance voltage is confirmed based on the change in the slope.

12. The method according to claim 11, wherein in the determination of the dielectric breakdown portion, when the insulation resistance voltage is less than the previous insulation resistance voltage, a voltage average of a battery pack over an entirety of the measurement section and an instantaneous value of the insulation resistance voltage measured when a measurement period ends is calculated and determined that the dielectric breakdown is a DC dielectric breakdown based on the calculated result.

13. The method according to claim 11, wherein in the determination of the dielectric breakdown portion, when the insulation resistance voltage exceeds the previous insulation resistance voltage, a voltage average of a battery pack within the same measurement period and an average of the insulation resistance voltage measured are calculated and determined that the dielectric breakdown is an AC dielectric breakdown based on the calculated result.

* * * * *